(12) United States Patent
Chuang

(10) Patent No.: US 7,829,480 B2
(45) Date of Patent: Nov. 9, 2010

(54) PCB SUPPORTING WOVEN FABRIC AND A PCB HAVING THE SAME

(75) Inventor: Mu-Chih Chuang, Taipei (TW)

(73) Assignee: Inventec Corporation, Taipei (TW)

( * ) Notice: Subject to any disclaimer, the term of this patent is extended or adjusted under 35 U.S.C. 154(b) by 268 days.

(21) Appl. No.: 12/010,375

(22) Filed: Jan. 24, 2008

(65) Prior Publication Data

US 2009/0191377 A1    Jul. 30, 2009

(51) Int. Cl.
*B32B 15/14* (2006.01)
*B32B 17/04* (2006.01)
*H05K 1/03* (2006.01)
*H05K 7/02* (2006.01)

(52) U.S. Cl. .................. 442/180; 442/218; 442/219; 428/172; 428/209; 428/365; 428/901; 361/748; 174/255

(58) Field of Classification Search .................. 428/172, 428/209, 365, 901; 442/180, 218, 219; 361/748; 174/255
See application file for complete search history.

(56) References Cited

U.S. PATENT DOCUMENTS 4,749,611 A * 6/1988 Furuya ...................... 442/202
6,325,110 B1 * 12/2001 Scari et al. ........... 139/426 TW

FOREIGN PATENT DOCUMENTS

JP      2000-315846 A    11/2000

* cited by examiner

*Primary Examiner*—Donald Loney
(74) *Attorney, Agent, or Firm*—CKC & Partners Co., Ltd.

(57) ABSTRACT

The present invention is to provide a printed circuit board (PCB) supporting woven fabric and a PCB having the same. The PCB includes a supporting woven fabric, a filling resin body enveloping the supporting woven fabric and at least one signal trace arranged on the surface of the filling resin body. The supporting woven fabric is made by a number of warp fiberglass strands and weft fiberglass strands interlaced mutually, wherein each of the warp fiberglass strands initially crosses above one weft fiberglass strand to separately form a bump upwardly and passes through under the next at least two weft fiberglass strands. The invention aims to decrease the number of the bumps bulged thereof to make the PCB improved in effectiveness and speed of signal transmission.

1 Claim, 3 Drawing Sheets

PCB SUPPORTING WOVEN FABRIC AND A PCB HAVING THE SAME

BACKGROUND

1. Field of Invention

This invention is related to a printed circuit board (PCB) and more particularly to a PCB with a supporting woven fabric to reduce the quantity of bumps formed on the supporting woven fabric.

2. Description of Related Art

A supporting board in a printed circuit board (PCB) used for upholding objects thereon is traditionally made by a piece of paper enveloped in resin. Nowadays, Referring to FIG. 1 a plain schematic diagram of a conventional fiberglass woven fabric, the supporting board of the PCB can be a fiberglass weaving work 500. The fiberglass weaving work 500 is woven by a plurality of fiberglass strands with longitudinal direction (called warp 510 as follows) interlaced through a plurality of fiberglass strands with latitudinal direction (called weft 520 as follows) wherein the warps 510 in an order of odd numbers are interlaced through every weft 520 by a rule of passing under one weft 520 first and then crossing over next one weft 520, and the warps 510 in an order of even numbers are interlaced through every weft 520 by a rule of crossing over one weft 520 first and then passing under next one weft 520, thus the fiberglass weaving work 500 presents the so-called "PLAIN WEAVING" in one leaf (i.e. the action of crossing) and one fly (i.e. the action of crossing) in the textile weaving jargon.

However, after the fiberglass weaving work 500 is processed to be a PCB, thousands of conductive traces are plated on the PCB and because every warp 510 that crosses over the weft 520 will respectively forms a bump upwardly on the fiberglass weaving work 500, some of those conductive traces will unavoidably be arranged to lie on the bumps. The bumps may weaken the power and slow the speed of transmitting signals through the conductive trace thereon to provide bad performance. Therefore, it is crucial to provide a new PCB supporting woven fabric to solve the problems for the Industry.

SUMMARY

It is therefore an objective of the present invention to present a PCB supporting woven fabric and a PCB having the same to improve signals in effectiveness and speed of transmission.

To achieve the foregoing objective, the present invention provides a printed circuit board (PCB) with a new supporting woven fabric. The PCB includes the supporting woven fabric, a filling resin body enveloping the supporting woven fabric and at least one signal trace lain on the surface of the filling resin body. The supporting woven fabric is made by a number of warp fiberglass strands and weft fiberglass strands interlacing mutually, wherein each of the warp fiberglass strands at least follows a rule of initially crossing above one weft fiberglass strand, then passing through under the next at least two weft fiberglass strands and finally crossing above a coming one weft fiberglass strand, and when each of the warp fiberglass strands crosses above the weft fiberglass strand, it separately forms a bump upwardly on the supporting woven fabric. The bumps bulged thereof still show the bulging profile on the surface of the filling resin body. Each signal trace on the filling resin body is arranged along one of the warp fiberglass strands or the weft fiberglass strands to lie on the bulging profile of the bumps on the filling resin body.

The present invention also provides another supporting woven fabric for a PCB, in which the supporting woven fabric made by a number of warp fiberglass strands and weft fiberglass strands interlacing mutually and the warp fiberglass strands and the weft fiberglass strands are all formed by bundling a number of fiber filaments drawn from glass. On the supporting woven fabric, each of the warp fiberglass strands crosses above one weft fiberglass strand initially and then individually passes through under different quantity of the next weft fiberglass strands.

Therefore, The supporting woven fabric in this invention aims to decrease the number of the bumps bulged thereof, thus to make the PCB improved in effectiveness and speed of signal transmission.

BRIEF DESCRIPTION OF THE DRAWINGS

The structure and the technical means adopted by the present invention to achieve the above and other objects can be best understood by referring to the following detailed description of the preferred embodiments and the accompanying drawings, where.

DESCRIPTION OF THE PREFERRED EMBODIMENTS

Figure 1:
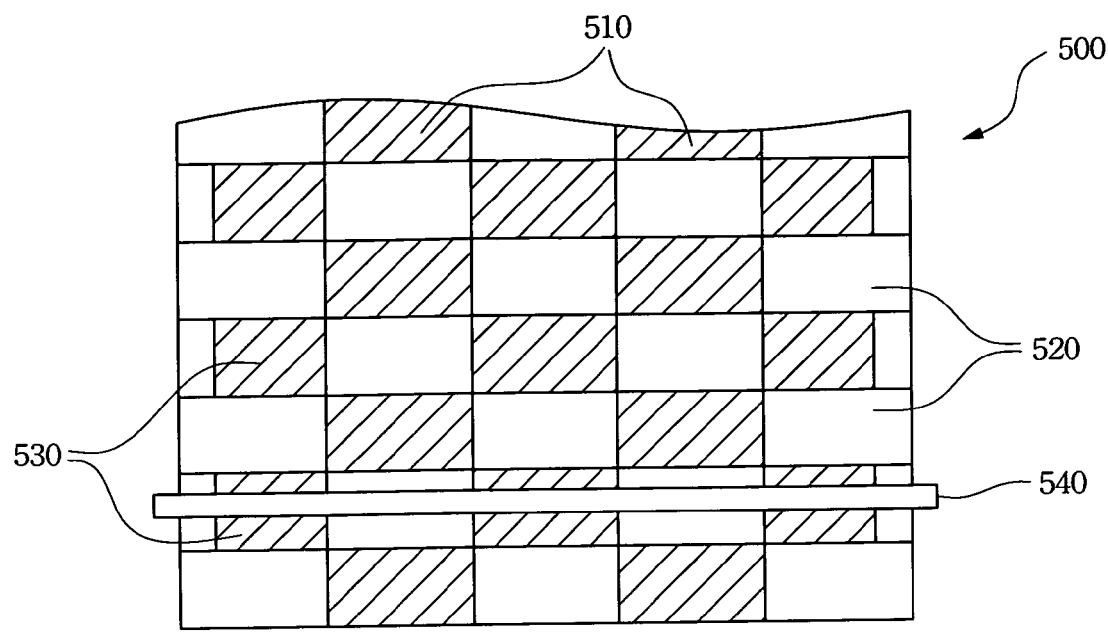
FIG. 1 is a plain schematic diagram of a conventional fiberglass woven fabric.

Reference will now be made in detail to the present embodiments of the invention, examples of which are illustrated in the accompanying drawings. Wherever possible, the same reference numbers are used in the drawings and the description to refer to the same or like parts.

Referring to FIG. 1, a section view of a PCB according to the present invention, the printed circuit board (called PCB1 as follows) that we discussed in this invention, only implies to one of multiple layers of a finished PCB product. The PCB 1 mainly includes a supporting woven fabric 2, a filling resin body 3 and at least one signal trace 4. The supporting woven fabric 2 is made by vertically interlacing a number of first fiberglass strands from warp direction and a number of second fiberglass strands from weft direction with each other. In this invention the first fiberglass strands from warp direction are named as warp fiberglass strands 21, and the second fiberglass strands from weft direction are named as weft fiberglass strands 22. Each of the warp fiberglass strands 21 and the weft fiberglass strands 22 are respectively made by bundling a number of fiber filaments drawn out from fused glass material.

The supporting woven fabric 2 discloses that each of the warp fiberglass strands 21 at least follows a rule of initially crossing above one weft fiberglass strand 22, then passing through under the next at least two weft fiberglass strands 22 and finally crossing above a coming one weft fiberglass strand 22, and when each of the warp fiberglass strands 21 respectively crosses above the weft fiberglass strands 22, it separately forms a bump 210 upwardly on the supporting woven fabric 2. Therefore, the supporting woven fabric 2 presents the so-called one leaf (i.e. the action of crossing) and few flies (i.e. the action of crossing) in the textile weaving jargon.

To form the filling resin body 3 is to soak the supporting woven fabric 2 into a liquid resin material (e.g. epoxy resin). The liquid resin material penetrates into the supporting woven fabric 2 including every interstice formed by interlacing the warp fiberglass strands 21 and the weft fiberglass strands 22, and covers each surface of the supporting woven fabric 2. After the liquid resin material of the supporting woven fabric 2 is getting cool and solid, the liquid resin material becomes a filling resin body 3 that envelops the supporting woven fabric 2. Because the filling resin body 3 coated on the supporting woven fabric 2 is quite thin, the filling resin body 3 presents bulging profiles where the bumps 210 under the filling resin body 3 are.

To form the signal trace 4 over the filling resin body 3 is first to process step of coating a copper substrate on both sides of the filling resin body 3, next to process step of etching and developing the copper substrate according to a pattern of layout design to leave at least one conductive wire as a signal trace 4f or transmitting high-speed signals on the surfaces of the filling resin body 3.

Each of these high-speed signals transmitted via the signal traces 4 will be getting impaired whenever it passes through over a bulging profile of the bump 210, that is, the more bulging profiles of the bump to go through, the less in effectiveness and transmission speed of the signal traces. Therefore, the invention is to aim at reducing the quantity of the bumps 210 upwardly bulged on the supporting woven fabric 2, thus to avoid the worse of the transmitting signals in effectiveness and transmission speed.

Figure 3:
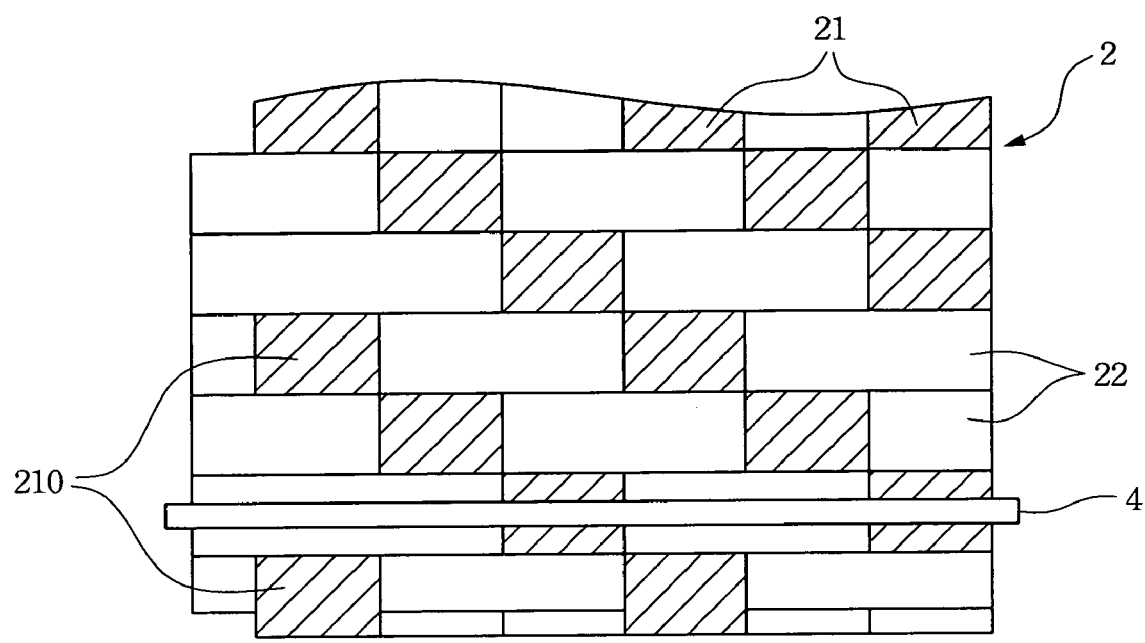
FIG. 3 is a plain schematic diagram of a fiberglass woven fabric according to a first embodiment of the present invention.

Referring to FIG. 3; it is a plain schematic diagram of a fiberglass woven fabric 2 according to a first embodiment of the present invention, and each square with oblique pattern of FIG. 3 is to represent a bump 210 bulged by a warp fiberglass strand 21 crossing above a weft fiberglass strand 22 and each square with blank of FIG. 3 is to represent a weft fiberglass strand 22 covering a warp fiberglass strand 21 beneath. The supporting woven fabric 2 in the first embodiment discloses a weaving rule that each of the warp fiberglass strands 21 initially crosses above one weft fiberglass strand 22 (see each square with oblique pattern in FIG. 3), then passes through under the next two weft fiberglass strands 22 (see each square with blank in FIG. 3) and finally crosses above a coming one weft fiberglass strand 22. Thus, the supporting woven fabric 2 presents the so-called "TWILL WEAVING" in one leaf (i.e. the action of crossing) and two flies (i.e. the action of crossing) in the textile weaving jargon.

Therefore, comparing with the quantity of bumps 210 (i.e. square with oblique pattern) on which the signal trace 4 lies in FIG. 3 and the quantity of bumps 530 (i.e. square with oblique pattern) on which the signal trace 540 lies in FIG. 1, the quantity of bumps 210 on which the signal trace 4 lies in FIG. 3 is two or three, less than the quantity of bumps 530 on which the signal trace 540 lies in FIG. 1, that is three or four.

Figure 4:
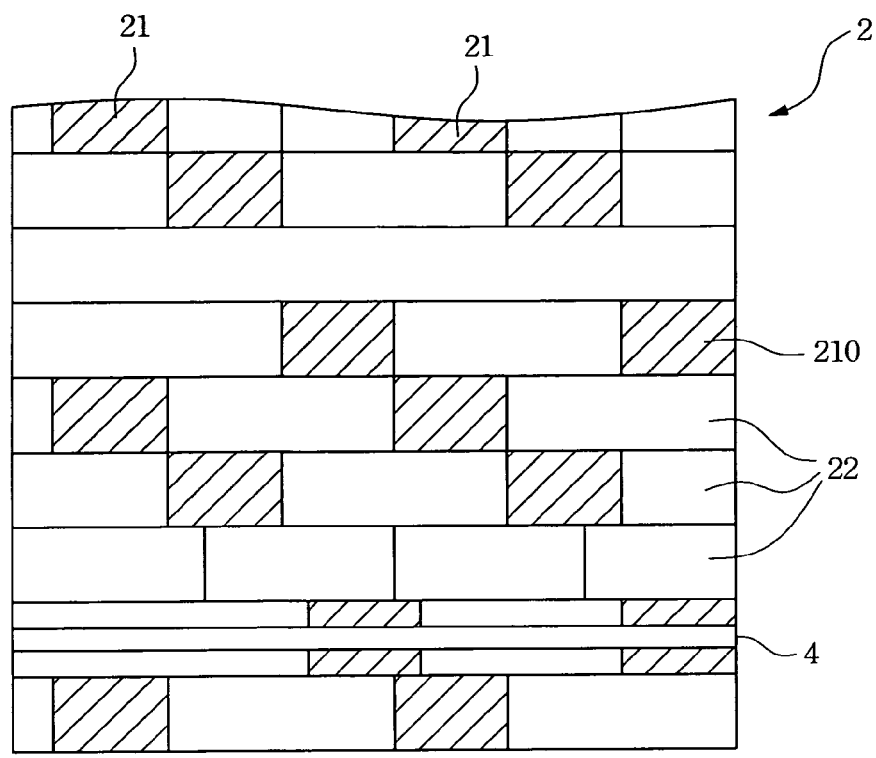
FIG. 4 is a plain schematic diagram of a fiberglass woven fabric according to a second embodiment of the present invention.

Referring to FIG. 4; it is a plain schematic diagram of a fiberglass woven fabric according to a second embodiment of the present invention, and each square with oblique pattern of FIG. 4 is to represent a bump 210 bulged by a warp fiberglass strand 21 crossing above a weft fiberglass strand 22 and each square with blank of FIG. 4 is to represent a weft fiberglass strand 22 covering a warp fiberglass strand 21 beneath. The supporting woven fabric 2 in the second embodiment discloses a weaving rule that each of the warp fiberglass strands 21 initially crosses above one weft fiberglass strand 22 (see each square with oblique pattern in FIG. 4), then passes through under the next three weft fiberglass strands 22 (see each square with blank in FIG. 4) and finally crosses above a coming one weft fiberglass strand 22. Thus, the supporting woven fabric 2 presents the so-called "TWILL WEAVING" in one leaf (i.e. the action of crossing) and three flies (i.e. the action of crossing) in the textile weaving jargon.

Therefore, comparing with the quantity of bumps 210 (i.e. square with oblique pattern) on which the signal trace 4 lies in FIG. 4 and the quantity of bumps 530 (i.e. square with oblique pattern) on which the signal trace 540 lies in FIG. 1, the quantity of bumps 210 on which the signal trace 4 lies in FIG. 4 is one or two, less than the quantity of bumps 530 on which the signal trace 540 lies in FIG. 1, that is three or four.

The foregoing embodiments all follow the rules of one leaf and two or three flies, hence, if a supporting woven fabric 2 follows a rule of one leaf and more than three flies, the quantity of bumps 210 (i.e. square with oblique pattern) on which the signal trace 4 lies can be reduced much more than the signal trace 4 in the foregoing embodiments to further enhance transmitting signals in effectiveness and transmission speed.

Figure 5:
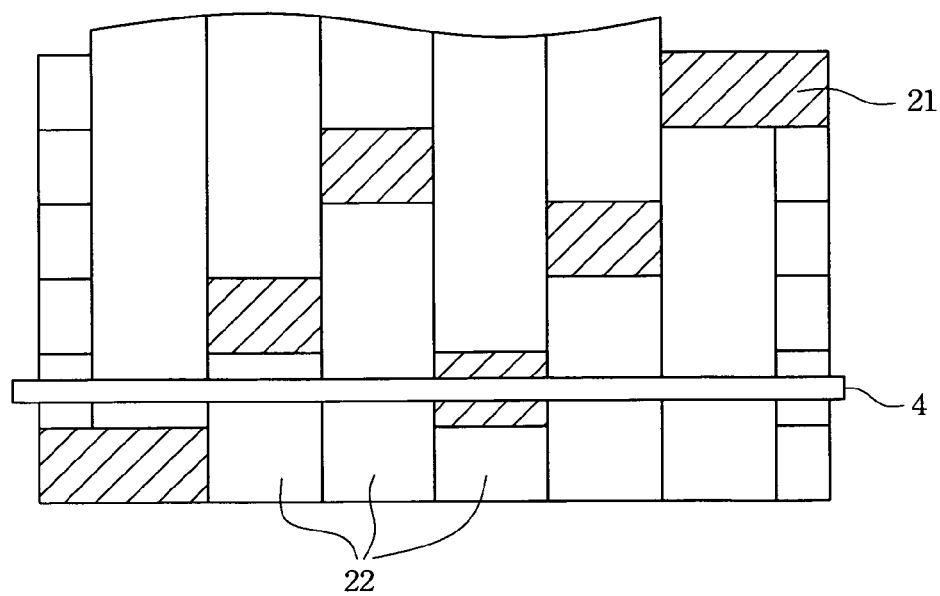
FIG. 5 is a plain schematic diagram of a woven fabric according to a third embodiment of the present invention.

FIG. 5 is shown a plain schematic diagram of a fiberglass woven fabric according to a third embodiment of the present invention, and each square with oblique pattern of FIG. 5 is to represent a bump 210 bulged by a warp fiberglass strand 21 crossing above a weft fiberglass strand 22 and each square with blank of FIG. 5 is to represent a weft fiberglass strand 22 covering a warp fiberglass strand 21 beneath. The supporting woven fabric 2 in the third embodiment discloses a weaving rule that each of the warp fiberglass strands 21 crosses above one weft fiberglass strand 22 (see each square with oblique pattern in FIG. 5) and passes through under different quantity of the next weft fiberglass strands 22 (see each square with blank in FIG. 5), and next crossing upon a coming weft fiberglass strand 22 at least. Thus, the supporting woven fabric 2 in the third embodiment presents the so-called "SATIN WEAVING" in the textile weaving jargon.

Therefore, comparing with the quantity of bumps 530 (i.e. square with oblique pattern) on which the signal trace 540 lies in FIG. 1 and the quantity of bumps 210 (i.e. square with oblique pattern) on which the signal trace 4 lies in FIG. 5, the quantity of bumps 210 on which the signal trace 4 lies in FIG. 4 is one, less than the quantity of bumps 530 on which the signal trace 540 lies in FIG. 1, that is three or four.

Figure 2:
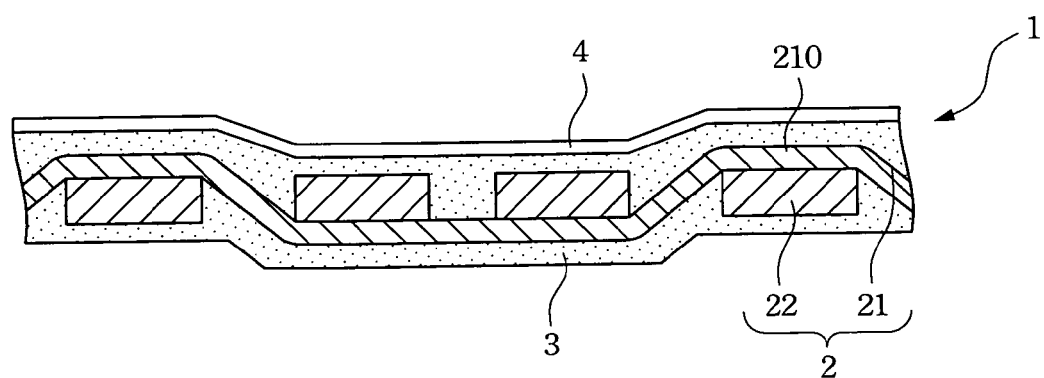
FIG. 2 is a section view of a PCB according to the present invention.

Since the concentration of the warp fiberglass strands 21 and weft fiberglass strands 22 interlaced mutually in the third embodiment is less than the concentration thereof in the first or second embodiment, the structure of supporting woven fabric 2 in the third embodiment indeed is looser than the structure in the first or second embodiment naturally. However, Referring to FIG. 2 again, because of the supporting woven fabric 2 enveloped by the filling resin body 3, the filling resin body 3 grabs and secures the supporting woven fabric 2 to avoid damaging the PCB 1 after finished.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A printed circuit board (PCB) with a supporting woven fabric, comprising:

a supporting woven fabric made by a plurality of warp fiberglass strands and a plurality of weft fiberglass strands interlaced mutually and vertically, wherein each of the warp fiberglass strands initially crosses above one weft fiberglass strand and then passes through under the next two to five weft fiberglass strands, and finally crosses above a coming one weft fiberglass strand at least, and each of the warp fiberglass strands crossing above everyone of the weft fiberglass strands separately forms a bump upwardly, and each of the warp fiberglass strands and the weft fiberglass strands are made by bundling a plurality of fiber filaments in glass;

a filling resin body enveloping the supporting woven fabric to cover each surface of the supporting woven fabric and penetrate into the supporting woven fabric including every interstice formed by interlacing the warp fiberglass strands and the weft fiberglass strands, wherein the surface of the filling resin body presents bulging profiles where the bumps under the filling resin body are; and at least one signal trace arranged on the surface of the filling resin body along one of the warp fiberglass strands or the weft fiberglass strands to lie on the bulging profiles of the bumps on the filling resin body.

* * * * *